(12) United States Patent
Landolt

(10) Patent No.: US 8,933,754 B2
(45) Date of Patent: Jan. 13, 2015

(54) LINEAR DIFFERENTIAL AMPLIFIER WITH HIGH INPUT IMPEDANCE

(75) Inventor: Oliver Landolt, Taufkirchen (DE)

(73) Assignee: Rohde & Schwarz GmbH & Co. KG, Muncih (DE)

(*) Notice: Subject to any disclaimer, the term of this patent is extended or adjusted under 35 U.S.C. 154(b) by 73 days.

(21) Appl. No.: 13/809,299

(22) PCT Filed: May 18, 2011

(86) PCT No.: PCT/EP2011/058063
§ 371 (c)(1),
(2), (4) Date: Jan. 9, 2013

(87) PCT Pub. No.: WO2012/004039
PCT Pub. Date: Jan. 12, 2012

(65) Prior Publication Data
US 2013/0113565 A1      May 9, 2013

(30) Foreign Application Priority Data
Jul. 9, 2010   (DE) .......................... 10 2010 026 629

(51) Int. Cl.
*H03F 3/45*   (2006.01)
*H03F 1/32*   (2006.01)
*H03F 1/48*   (2006.01)

(52) U.S. Cl.
CPC ............ *H03F 3/4508* (2013.01); *H03F 1/3211* (2013.01); *H03F 1/48* (2013.01); *H03F 1/483* (2013.01); *H03F 3/45085* (2013.01); *H03F 3/45183* (2013.01); *H03F 2203/45302* (2013.01); *H03F 2203/45304* (2013.01); *H03F 2203/45318* (2013.01); *H03F 2203/45392* (2013.01)
USPC .......................................... 330/252; 330/261

(58) Field of Classification Search
USPC .......................................... 330/252, 261, 254
See application file for complete search history.

(56) References Cited

U.S. PATENT DOCUMENTS

| 4,769,617 | A | 9/1988 | Mizuide |
| 5,587,689 | A | 12/1996 | Bowers |
| 5,742,248 | A * | 4/1998 | Vorenkamp et al. .......... 341/156 |
| 5,912,587 | A * | 6/1999 | Mihailovits et al. .......... 330/252 |
| 8,554,162 | B2 * | 10/2013 | Lindstrand et al. ........ 455/127.1 |
| 2009/0184766 | A1 | 7/2009 | Li |
| 2011/0182129 | A1 * | 7/2011 | Lee ............................... 365/207 |

FOREIGN PATENT DOCUMENTS

EP   1033809 A1   9/2000

OTHER PUBLICATIONS

International Search Report for PCT/EP2011/058063 mailed Jan. 9, 2011, pp. 1-4.
Raimondo Caprio, "Precision differential voltage-current converter" Electronics Letter, Mar. 22, 1973, vol. 9, No. 6, pp. 147-148.
International Preliminary Report on Patentability and Written Opinion of the International Searching Authority for International Application No. PCT/EP2011/058063, dated Jan. 15, 2013, 7 pages.

* cited by examiner

*Primary Examiner* — Henry Choe
(74) *Attorney, Agent, or Firm* — Ditthavong & Steiner, P.C.

(57) ABSTRACT

A differential amplifier provides an amplifier circuit including two differential pairs. A first differential pair is connected in series to a second differential pair. The second differential pair is connected in a crosswise manner at least indirectly to a differential output signal of the first differential pair. The first differential pair and the second differential pair form a first differential current path and a second differential current path. A first emulation device is connected in parallel to the first current path. A second emulation device is connected in parallel to the second current path.

17 Claims, 4 Drawing Sheets

LINEAR DIFFERENTIAL AMPLIFIER WITH HIGH INPUT IMPEDANCE

CROSS-REFERENCE TO RELATED APPLICATION

The present application is a national phase application of PCT Application No. PCT/EP2011/058063, filed on May 18, 2011, and claims priority to German Application No. DE 10 2010 026 629.9, filed on Jul. 9, 2010, the entire contents of which are herein incorporated by reference.

BACKGROUND OF THE INVENTION

1. Field of the Invention

The invention relates to an amplifier, especially a differential amplifier.

2. Discussion of the Background

By convention, differential amplifiers comprise at least two transistors, which are connected to form a differential pair. However, such simple amplifiers are characterized by poor linearity. The linearity of amplifiers can be improved through the introduction of resistors into the emitter path. However, this reduces the efficiency of the amplifier. Moreover, at the same time, the amplification factor is reduced.

An amplifier based on 4 transistors, a Caprio's Quad, is also known. Such an amplifier is characterised by a high linearity and an adjustable amplification factor. For example, "Precision differential voltage-current converter, Raimondo Caprio, Electronics Letters, Vol. 9, No. 6, 1973" shows such a differential amplifier.

Especially at high frequencies, an amplifier according to Caprio demonstrates unfavourable behavior.

SUMMARY OF THE INVENTION

The invention advantageously provides a differential amplifier which guarantees a high linearity with an adjustable amplification factor over a broad frequency range.

A differential amplifier according to an embodiment of the invention provides an amplifier circuit comprising two differential pairs. A first differential pair is connected in series to a second differential pair. The second differential pair is connected at control terminals in a crosswise manner at least indirectly to a differential output signal of the first differential pair. The first differential pair and the second differential pair form a first differential current path and a second differential current path. A first emulation device is connected in parallel to the first current path. A second emulation device is connected in parallel to the second current path.

A differential amplifier according to an embodiment of the invention preferably contains an amplifier corresponding to Caprio's Quad. This preferably comprises four transistors and two resistors. A first differential pair of transistors is accordingly connected to the differential signal outputs by their collector terminals. They are connected to differential signal inputs by their base terminals. The emitter terminals of this first differential pair are connected by collector terminals to a second differential pair of transistors. The emitter terminals of this second pair are connected to earth via the resistors and a current source. The base terminals of this second pair are connected in a crosswise manner to the collector terminals.

A second differential pair comprising a fifth and a sixth transistor is preferably connected in parallel to the first differential pair. In this context, the base of the fifth transistor is connected to the base of a second transistor of the first pair, and the base of the sixth transistor is connected to the base of a first transistor of the first pair. The collectors of the first and fifth transistors and of the second and sixth transistors are therefore connected to each other.

Furthermore, a fourth differential pair of transistors is preferably connected in series to the third differential pair. The collectors of the fourth differential pair comprising a seventh and an eighth transistor are connected to the emitters of the third differential pair. The base terminals and the emitter terminals of the fourth differential pair are connected to the base terminals or the emitter terminals of the second differential pair. In this manner, a high, adjustable amplification is achieved with favourable high-frequency properties.

BRIEF DESCRIPTION OF THE DRAWINGS

In the following section, the invention is described by way of example on the basis of the drawings in which an advantageous exemplary embodiment of the invention is shown. The drawings are as follows.

DETAILED DESCRIPTION OF EXEMPLARY EMBODIMENTS OF THE INVENTION

With reference to FIGS. 1 to 5, the structure and the functioning of various exemplary differential amplifiers and the problem on which the present invention is based are initially described. Following this, the structure and the functioning of an exemplary embodiment of the amplifier according to the invention is illustrated by means of FIG. 6. In some cases the presentation and description of identical elements in similar drawings has not been repeated.

Figure 1:
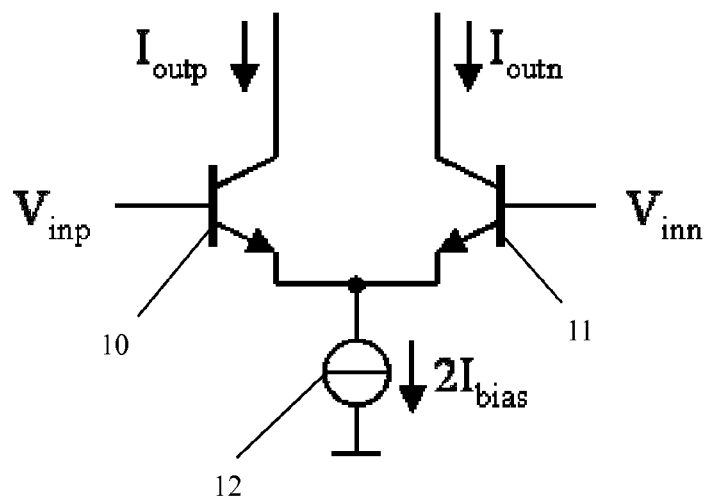
FIG. 1 a first exemplary differential amplifier.

FIG. 1 shows a differential pair comprising two transistors 10, 11 as the core of most electronic differential amplifiers. The differential input signal $V_{in}$ is the difference between the two differential input signals $V_{inp}$, $V_{inn}$. The differential output signal $I_{out}$ is the difference between the differential output signals $I_{outp}$, $I_{outn}$. The output current in this case can reach a maximum magnitude of $+/-2I_{bias}$, the current of a current source 12. The base of the first transistor 10 in this context is supplied with the input signal $V_{inp}$, while the base of the second transistor 11 is supplied with the input signal $V_{inn}$. The emitters of the two transistors 10, 11 are connected to each other and to the current source 12. The second terminal of the current source 12 is connected to earth. The differential output currents $I_{outp}$ and $I_{outn}$ are connected to the collectors of the transistors 10, 11.

Figure 2:
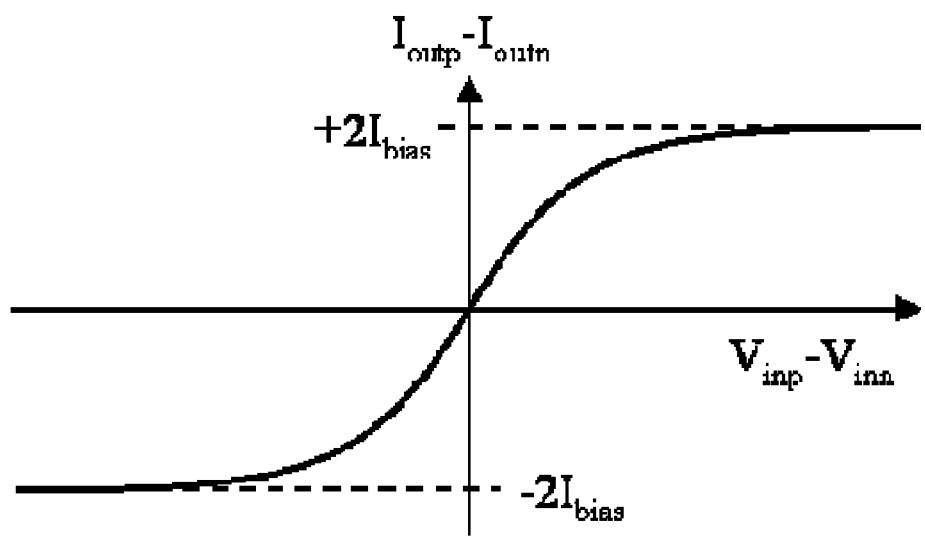
FIG. 2 the characteristic of the first exemplary amplifier.

FIG. 2 shows the voltage-current characteristic of the exemplary amplifier from FIG. 1. The non-linear form of the characteristic over wide voltage ranges can clearly be recognized. For applications, for which a high linearity of the amplifier is necessary, the voltage range in which the amplifier is used must therefore be significantly limited. Another disadvantage of this amplifier is that the amplification factor depends only on the transistors used and cannot be adjusted. A further disadvantage of the differential amplifier shown in FIG. 1 is that the amplification factor and the maximum output current $+/-2I_{bias}$ are adjusted by the same parameter, $I_{bias}$. Because of this physical dependency, it is not possible to adjust the amplification factor and the maximum output signal independently of one another.

Figure 3:
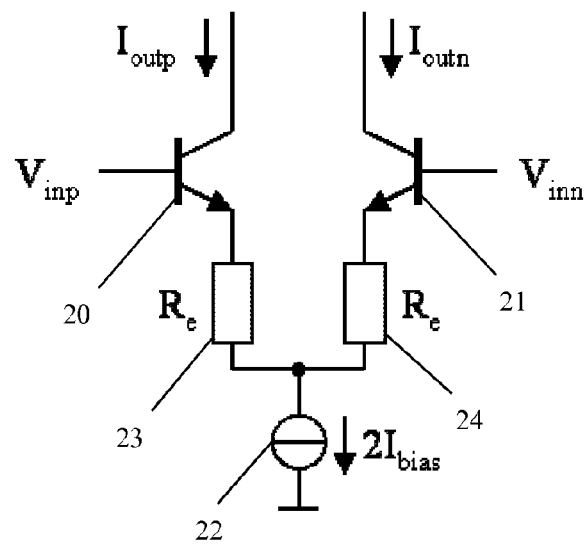
FIG. 3 a second exemplary differential amplifier.

The linearity of the amplifier shown in FIG. 1 can be improved by introducing ohmic resistors into the emitter current path. An amplifier improved in this manner is shown in FIG. 3. The emitters of the transistors 20, 21 are each connected to an ohmic resistor 23, 24. The ohmic resistors 23, 24 are then connected to the current source 22, which corresponds to the current source 12 from FIG. 1. In this amplifier, the maximum output current is also $+/-2I_{bias}$.

Figure 4:
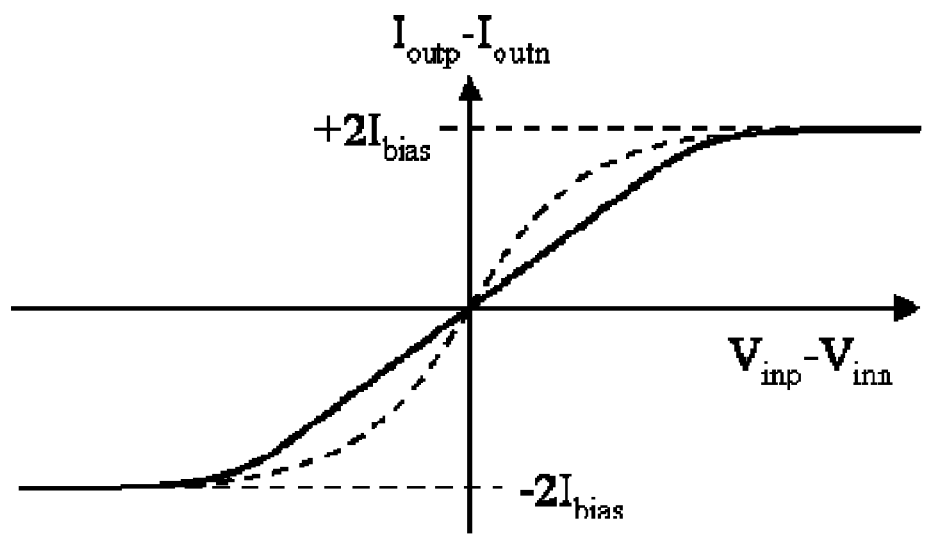
FIG. 4 the characteristic of the second exemplary amplifier.

FIG. 4 shows the characteristic of the exemplary differential amplifier presented in FIG. 3. The significant improvement of linearity compared with the characteristic shown as a dotted line in FIG. 2 can be seen clearly. A good linearity can thus be achieved over a significantly larger voltage range. A limitation of the voltage range must only be significantly lower than in the amplifier according to FIG. 1. However, one disadvantage of the differential amplifier shown in FIG. 3 is the reduction of the amplification factor. The characteristic shown in FIG. 4 thus shows a significantly reduced gradient in the linear range than the characteristic which is shown as a dotted line, which corresponds to the characteristic in FIG. 2.

By contrast, the amplifier shown in FIG. 3 allows an independent adjustment of both parameters on the basis of the ohmic resistors 23, 24. However, because only positive ohmic resistors can be realized, the amplification factor can only be reduced by the ohmic resistors 23, 24 relative to the amplification factor of the differential amplifier in FIG. 1. This means that an increase in the gradient of the amplification characteristic is not possible with this amplifier concept.

In applications, in which very small input voltages must be amplified, it would be desirable to maintain a highly linear voltage-current characteristic, without impairing the amplification factor. Ideally, the voltage-current characteristic of the amplifier should remain completely linear up to the maximum output signal.

Figure 5:
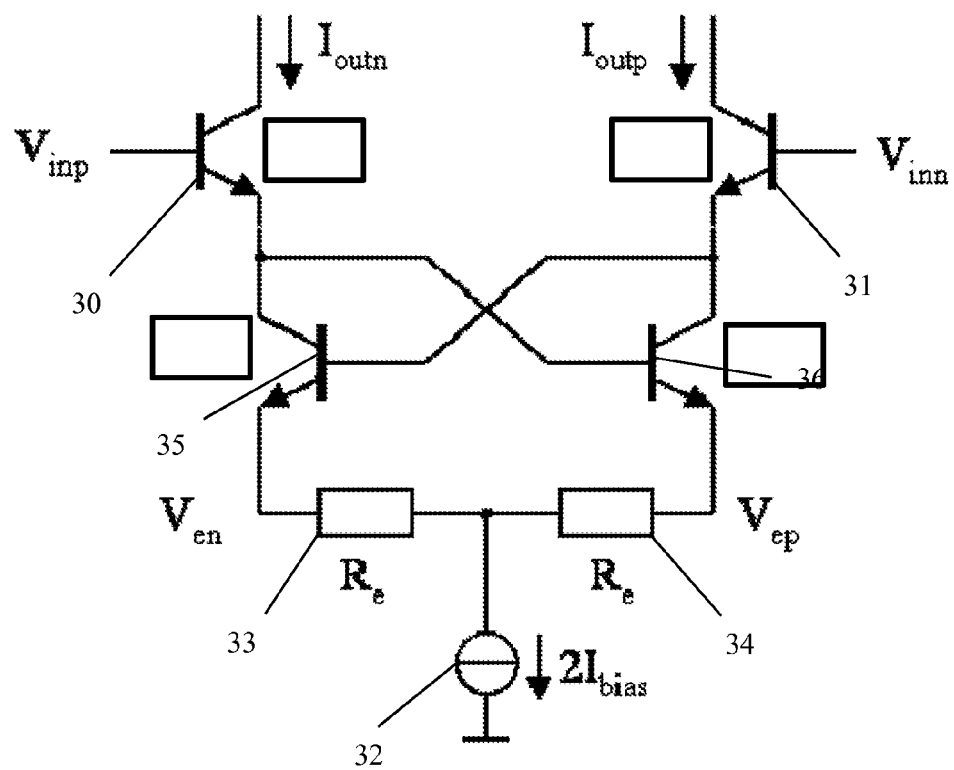
FIG. 5 a third exemplary differential amplifier.

The starting point of the present invention is the so-called "Caprio's Quad". Such a differential amplifier is shown in FIG. 5. The base of a first and a second transistor 30, 31 is connected respectively to a differential input voltage. The emitters of these transistors 30, 31 are each connected to a collector of a further transistor 35, 36. Furthermore, the emitters of the transistors 30, 31 are connected in a crosswise manner to the base terminals of the transistors 36, 35. The emitter terminals of the transistors 35, 36 are each connected to a resistor 33, 34. The resistors 33, 34 are connected to earth via a current source 32. The differential output signals $I_{outn}$, $I_{outp}$ are connected to the collectors of the transistors 30, 31.

The voltage drop $V_{inp}-V_{ep}$ here is the sum of the base-emitter voltages of the transistors 30, 36. The voltage drop $V_{inn}-V_{en}$ corresponds to the base-emitter voltages of the transistors 31, 35. The collector currents of the transistors 30, 35 correspond to the differential output signal $I_{outn}$. In a very good approximation, the voltage drops $V_{inp}-V_{ep}$ and $V_{inn}-V_{en}$ correspond to one another, because they each correspond to the sum of two base-emitter voltages originating from identical currents. The voltage difference $V_{ep}-V_{en}$ is therefore approximately identical to the differential input voltage $V_{inp}-V_{in}$. The differential output current is thus $(V_{ep}-V_{en})/R_e$. This corresponds with a very good approximation up to the maximal output signal of the current $(V_{inp}-V_{inn})/R_e$. When the maximum output current $2I_{bias}$ is reached, this entire current flows through one side of the circuit.

The amplifier from FIG. 5, the Caprio's Quad, offers the desired high linearity up to the maximum output signal. At the same time, the maximum output signal and the amplification factor can be adjusted completely independently of one another. The maximum output signal is adjusted by the current $I_{bias}$, which is made available by the current source 32. The amplification factor is adjusted by the resistors 33, 34. These are identical in this case. By increasing the resistances so that 1 divided by $R_e$ is smaller than the amplification factor of the individual transistors 30, 31, an amplification factor which is larger than that of a conventional differential pair can even be achieved.

However, one disadvantage of the amplifier circuit shown in FIG. 5 is its behavior at relatively high frequencies. As a result of the crosswise connections between the transistors 35 and 36, an output current $I_{outn}$ flows through the input transistor 30 which is connected to the input voltage $V_{inp}$. At the same time, the output current $I_{outp}$ flows through the input transistor 31, which is connected to the input voltage $V_{inn}$. As a result of the crosswise connections of the currents, a negative input admittance of the circuit is obtained with a direct current. In addition to this static component, it is evident that, with an alternating current, the input admittance corresponds to a negative capacity. By contrast, the input conductivity and impedance in the amplifier circuits shown in FIG. 1 and FIG. 3 respectively are always positive. These dynamic difficulties allow the use of the amplifier circuit shown in FIG. 5 only in relatively slow circuits. These problems can therefore be overcome through a reduction of the bandwidth.

The dynamic difficulties of the amplifier circuit shown in FIG. 5 also increase with a decreasing $R_e$. The theoretical possibility of realizing a high amplification by setting $R_e$ close to zero can therefore not be achieved in practice.

Figure 6:
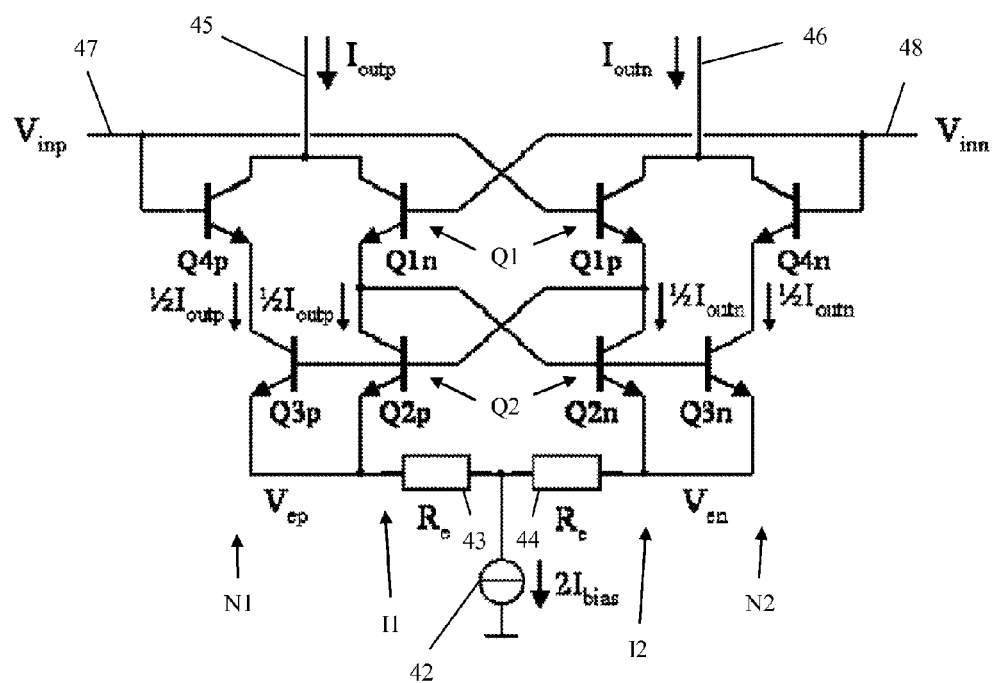
FIG. 6 an exemplary embodiment of the differential amplifier according to the invention.

The differential amplifier according to the invention is also substantially based on the known amplifier according to FIG. 5—the Caprio's Quad. However, a negative input admittance is compensated by the addition of a positive admittance of the same magnitude and phase over a large frequency range. Such a differential amplifier according to the invention is shown in FIG. 6.

A first transistor Q1n is connected by its base to the input signal $V_{inn}$. The collector of the first transistor Q1n is connected to an output 45. The base of a second transistor Q1p is connected to the differential input signal $V_{inp}$. The collector of the second transistor Q1p is connected to a second differential output 46. The emitter of the first transistor Q1n is connected to the collector of a third transistor Q2p. The base of the third transistor Q2p is connected by means of a crosswise connection to the emitter of the second transistor Q1p. The emitter of the second transistor Q1p is further connected to the collector of a fourth transistor Q2n. The base of the fourth transistor Q2n is also connected by means of a crosswise connection to the emitter of the first transistor Q1n. The emitter of the third transistor Q2p is connected to a current source 42 via a resistor 43. The emitter of the fourth transistor Q2n is also connected to the current source 42 via a resistor 44. The current source 42 is connected to earth.

The transistors Q1n and Q1p in this case form a first differential pair Q1. The transistors Q2n and Q2p form a second differential pair Q2. The transistors Q1n and Q2p form a first current path I1. The transistors Q1p and Q2n form a second current path I2.

The circuit which has been described so far corresponds to the amplifier circuit from FIG. 5. The collector of a fifth transistor Q4p is also connected to the first output terminal 45. The base of the fifth transistor Q4p is also connected to the input 47. The emitter of the fifth transistor Q4p is connected to the collector of a seventh transistor Q3p. The base of the seventh transistor Q3p is connected to the base of the third transistor Q2p. This means that the base of the seventh transistor Q3p is also connected via the crosswise connection to the emitter of the second transistor Q1p. The emitter of the seventh transistor Q3p is additionally connected to the current source 42 via the resistor 43. This means that the emitter of the seventh transistor is connected to the emitter of the third transistor.

Furthermore, the collector of a sixth transistor Q4n is connected to the output 46 and therefore also to the collector of the second transistor Q1p. The base of the sixth transistor Q4n is connected to the output 48 and therefore to the base of the first transistor Q1n. The emitter of the sixth transistor Q4n is also connected to the collector of an eighth transistor Q3n. The base of the eighth transistor Q3n is connected in this case to the base of the fourth transistor Q2n and thus connected via a crosswise connection to the emitter of the transistor Q1n. The emitter of the eighth transistor Q3n is connected to the current source 42 via the resistor 44. This means that the emitter of the eighth transistor Q3n is connected to the emitter of the fourth transistor Q2n. The transistors Q4p and Q3p form a first emulation device N1. The transistors Q4n and Q3n form a second emulation device N2.

In this context, all of the transistors preferably show consistent characteristics. Ideally, all of the transistors are identical. Because the base terminals and the emitter terminals of the transistors Q2p and Q3p are connected to each other, these show identical collector currents $½ I_{outp}$. Similarly, the collector currents of the transistors Q2n and Q3n are identically $½ I_{outn}$. The voltage drop $V_{inp}-V_{ep}$ is the sum of the base-emitter voltages of the transistors Q1p and Q2p or Q3p of which the collector currents are each $½ I_{outn}$ and $½ I_{outp}$. The voltage drop $V_{inn}-V_{en}$ is identical to the voltage drop of $V_{inp}-V_{ep}$, because it also corresponds to two base-emitter voltages with the same currents in the opposite direction. The differential output current $I_{outp}-I_{outn}$ is thereby approximately identical to $(V_{inp}-V_{inn})/R_e$. This corresponds to the behavior of the amplifier shown in FIG. 5.

The current which is drawn from the input 47 is the sum of the base currents of the transistors Q1p and Q4p. The collector currents of these transistors are $½ I_{outn}$ and $½ I_{outp}$. In a very good approximation, the two base currents add up to a constant, independently of the differential input signal. The current which is drawn at the output 48 is also independent of the input voltage. The emulation device N1 thus compensates the current flow in the input terminal 47 caused by the first current path I1, while the emulation device N2 compensates the current flow in the input terminal 48 caused by the second current path I2.

The input admittance of the circuit is thus close to zero. With detailed calculations, which take account of finite current amplifications, it can be shown that the input admittance with a direct current is positive and has a magnitude of $1/(\beta^2 \times R_e)$. In this case, $\beta$ is the current amplification of the transistors. The input admittance here is very small and positive up to very high frequencies. As a comparison, the amplifier according to FIG. 3 shows a direct-current admittance of $1/(\beta \times R_e)$. The input admittance of the amplifier in FIG. 5 corresponds approximately to $-1/(\beta \times R_e)$.

A further advantage of the amplifier circuit according to the invention is the stability independently of the size of the resistors 43, 44. It is therefore possible to reach a very high amplification in a single-stage differential amplifier. The exemplary embodiment shown in FIG. 6 uses bipolar transistors as the transistors. However, other kinds of transistors could also be used equally well. For example, MOS transistors can be used.

Although MOS transistors already have an admittance of zero with a direct current, the amplifier circuit according to the invention is still useful, because it provides a very small input capacity compared with conventional differential pairs or compared with Caprio's Quad.

The invention is not restricted to the exemplary embodiment presented. As already mentioned, other kinds of transistors can, for example, be used. All of the features described above or shown in the drawings can be advantageously combined with one another as required within the framework of the invention.

The invention claimed is:

1. A differential amplifier with an amplifier circuit comprising two differential pairs,
    wherein a first differential pair is connected in series to a second differential pair,
    wherein the second differential pair is connected at control terminals in a crosswise manner at least indirectly to a differential output signal of the first differential pair,
    wherein the first differential pair and the second differential pair form a first differential current path and a second differential current path,
    wherein a first emulation device is connected in parallel to the first current path, and that a second emulation device is connected in parallel to the second current path,
    wherein the first emulation device emulates the current flow through the first current path,
    wherein the second emulation device emulates the current flow through the second current path,
    wherein the first current path is supplied at a current input with a first partial signal of the differential input signal,
    wherein the second current path is supplied at a control input with a second partial signal of the differential input signal,
    wherein the first emulation device is supplied at a first control input with the second partial signal of the differential input signal, and
    wherein the second emulation device is supplied at a control input with the first partial signal of the differential input signal.

2. The differential amplifier according to claim 1,
    wherein a current flow through the control input of the first emulation device compensates a current flow through the control input of the first current path, and
    wherein a current flow through the control input of the second emulation device compensates a current flow through the control input of the second current path.

3. A differential amplifier with an amplifier circuit comprising two differential pairs,
    wherein a first differential pair is connected in series to a second differential pair,
    wherein the second differential pair is connected at control terminals in a crosswise manner at least indirectly to a differential output signal of the first differential pair,
    wherein the first differential pair and the second differential pair form a first differential current path and a second differential current path,
    wherein a first emulation device is connected in parallel to the first current path, and that a second emulation device is connected in parallel to the second current path,
    wherein the first differential pair comprises a first transistor and a second transistor,
    wherein the second differential pair comprises a third transistor and a fourth transistor,
    wherein the first emulation device comprises a fifth transistor and a seventh transistor,
    wherein the second emulation device comprises a sixth transistor and an eighth transistor,
    wherein first terminals of the first transistor and of the second transistor are each connected to an output, wherein a second terminal of the first transistor is connected to a first terminal of the third transistor, and a second terminal of the second transistor is connected to a first terminal of the fourth transistor, wherein a second terminal of the third transistor is connected via a first resistor and a current source to earth, and a second terminal of the fourth transistor is connected via a second resistor and the current source to earth, wherein third terminals of the first transistor and the second transistor are each connected to an input, and wherein the second terminal of the first transistor is connected to a third terminal of the fourth transistor, and the second terminal of the second transistor is connected to a third terminal of the third transistor.

4. The differential amplifier according to claim 3,
wherein the first terminals of the fifth transistor and of the sixth transistor are connected to outputs, and
wherein third terminals of the fifth transistor and of the sixth transistor are each connected to an input.

5. The differential amplifier according to claim 3
wherein the first terminal of the first transistor is connected to the first output,
wherein the first terminal of the second transistor is connected to the second output,
wherein the third terminal of the first transistor is connected to the second input, and
wherein the third terminal of the second transistor is connected to the first input.

6. The differential amplifier according to claim 3,
wherein the first terminal of the fifth transistor is connected to the first output,
wherein the first terminal of the sixth transistor is connected to the second output,
wherein the third terminal of the fifth transistor is connected to the first input,
wherein the third terminal of the sixth transistor is connected to the second input.

7. The differential amplifier according to claim 3,
wherein a second terminal of the fifth transistor is connected to a first terminal of the seventh transistor, and a second terminal of the sixth transistor is connected to a first terminal of the eighth transistor,
wherein a second terminal of the seventh transistor is connected to the second terminal of the third transistor, and a second terminal of the eighth transistor is connected to the second terminal of the fourth transistor, and
wherein a third terminal of the seventh transistor is connected to the second terminal of the second transistor and a third terminal of the eighth transistor is connected to the second terminal of the first transistor.

8. The differential amplifier according to claim 3,
wherein the first terminals of the transistors are collector terminals or drain terminals,
wherein the second terminals of the transistors are emitter terminals or source terminals, and
wherein the third terminals of the transistors are base terminals or gate terminals.

9. The differential amplifier according to claim 1,
wherein the amplifier draws only a very small current, especially no current, from the first input and the second input.

10. The differential amplifier according to claim 3,
wherein the first transistor is of identical structure to the fifth transistor,
wherein the second transistor is of identical structure to the sixth transistor,
wherein the third transistor is of identical structure to the seventh transistor, and
wherein the fourth transistor is of identical structure to the eighth transistor.

11. The differential amplifier according to claim 3,
wherein all of the transistors are of identical structure.

12. The differential amplifier according to claim 3,
wherein a current through the first transistor and third transistor largely corresponds to a current through the fifth transistor,
and
wherein a current through the second transistor and fourth transistor largely corresponds to a current through the sixth transistor.

13. The differential amplifier according to claim 3,
wherein a current through the first transistor and third transistor largely corresponds to a current through the fifth transistor and seventh transistor, and
wherein a current through the second transistor and fourth transistor largely corresponds to a current through the sixth transistor and eighth transistor.

14. The differential amplifier according to claim 3,
wherein the transistors are bipolar transistors and/or field-effect transistors.

15. The differential amplifier according to claim 12,
wherein the first differential pair comprises a first transistor and a second transistor,
wherein the second differential pair comprises a third transistor and a fourth transistor,
wherein the first emulation device comprises a fifth transistor and a seventh transistor, and
wherein the second emulation device comprises a sixth transistor and an eighth transistor.

16. The differential amplifier according to claim 1,
wherein the first differential pair comprises a first transistor and a second transistor,
wherein the second differential pair comprises a third transistor and a fourth transistor,
wherein the first emulation device comprises a fifth transistor and a seventh transistor, and
wherein the second emulation device comprises a sixth transistor and an eighth transistor.

17. The differential amplifier according to claim 2,
wherein the first differential pair comprises a first transistor and a second transistor,
wherein the second differential pair comprises a third transistor and a fourth transistor,
wherein the first emulation device comprises a fifth transistor and a seventh transistor, and
wherein the second emulation device comprises a sixth transistor and an eighth transistor.

* * * * *